US006482571B1

(12) United States Patent
Teng

(10) Patent No.: US 6,482,571 B1
(45) Date of Patent: Nov. 19, 2002

(54) ON-PRESS DEVELOPMENT OF THERMOSENSITIVE LITHOGRAPHIC PLATES

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

(21) Appl. No.: 09/656,052

(22) Filed: Sep. 6, 2000

(51) Int. Cl.[7] .................................................. G03F 7/09

(52) U.S. Cl. ....................... 430/302; 430/303; 430/348; 430/273.1; 430/278.1; 430/281.1; 430/286.1; 430/287.1; 430/288.1; 430/944; 430/945; 430/964; 101/453; 101/454; 101/456; 101/457; 101/465; 101/467

(58) Field of Search ........................... 430/270.1, 273.1, 430/278.1, 281.1, 286.1, 287.1, 288.1, 302, 303, 348, 944, 945, 964; 101/453, 454, 456, 457, 465, 466, 467

(56) References Cited

U.S. PATENT DOCUMENTS

| | | | | | |
|---|---|---|---|---|---|
| 4,132,168 | A | | 1/1979 | Petersen | 101/471 |
| 4,997,745 | A | * | 3/1991 | Kawamura et al. | 430/281 |
| 5,258,263 | A | | 11/1993 | Cheema et al. | 430/309 |
| 5,379,698 | A | | 1/1995 | Nowak et al. | 101/454 |
| 5,491,046 | A | | 2/1996 | DeBoer et al. | 430/302 |
| 5,516,620 | A | | 5/1996 | Cheng et al. | 430/138 |
| 5,616,449 | A | | 4/1997 | Cheng et al. | 430/302 |
| 5,674,658 | A | | 10/1997 | Burbery et al. | 430/262 |
| 5,677,106 | A | | 10/1997 | Burbery et al. | 430/253 |
| 5,677,110 | A | | 10/1997 | Chia et al. | 430/302 |
| 5,705,309 | A | | 1/1998 | West et al. | 430/167 |
| 5,807,659 | A | * | 9/1998 | Nishimiya et al. | 430/302 |
| 5,849,462 | A | * | 12/1998 | Li et al. | 430/283.1 |
| 5,910,395 | A | * | 6/1999 | Li et al. | 430/302 |
| 5,925,497 | A | * | 7/1999 | Li et al. | 430/278.1 |
| 5,939,237 | A | * | 8/1999 | Gardner, Jr. et al. | 430/273.1 |
| 5,998,095 | A | * | 12/1999 | Nagase | 430/273.1 |
| 6,014,929 | A | | 1/2000 | Teng | 101/456 |
| 6,051,367 | A | * | 4/2000 | Kunita et al. | 430/281.1 |
| 6,066,434 | A | * | 5/2000 | Blanchet-Fincher et al. | 430/273.1 |
| 6,068,963 | A | * | 5/2000 | Aoshima | 430/270.1 |
| 6,071,675 | A | | 6/2000 | Teng | 430/302 |
| 6,153,356 | A | * | 11/2000 | Urano et al. | 430/281.1 |
| 6,159,657 | A | * | 12/2000 | Fleming et al. | 430/270.1 |
| 6,165,676 | A | * | 12/2000 | Hattori | 430/270.1 |
| 6,171,735 | B1 | * | 1/2001 | Li et al. | 430/12 |
| 6,190,830 | B1 | * | 2/2001 | Leon et al. | 430/270.1 |
| 6,190,831 | B1 | * | 2/2001 | Leon et al. | 430/270.1 |
| 6,210,857 | B1 | * | 4/2001 | Vermeersch et al. | 430/270.1 |
| 6,232,038 | B1 | * | 5/2001 | Takasaki et al. | 430/281.1 |
| 6,242,156 | B1 | * | 6/2001 | Teng | 430/270.1 |
| 6,245,477 | B1 | * | 6/2001 | Ray et al. | 430/138 |
| 6,251,563 | B1 | * | 6/2001 | Van Damme et al. | 430/302 |
| 6,277,541 | B1 | * | 8/2001 | Uno et al. | 430/278.1 |
| 6,298,780 | B1 | * | 10/2001 | Ben-Horin et al. | 101/478 |

* cited by examiner

*Primary Examiner*—Janet Baxter
*Assistant Examiner*—Barbara Gilmore

(57) ABSTRACT

This patent describes on-press ink and/or fountain solution development of lithographic plates having on a substrate a thermosensitive layer capable of hardening or solubilization upon exposure to an infrared laser radiation. The plate can be imagewise exposed with an infrared laser and then on-press developed with ink and/or fountain solution by rotating the plate cylinder and engaging ink and/or fountain solution roller. The developed plate can then directly print images to the receiving sheets. The imagewise exposure can be performed off the press or with the plate being mounted on the plate cylinder of a lithographic press.

41 Claims, No Drawings

ON-PRESS DEVELOPMENT OF THERMOSENSITIVE LITHOGRAPHIC PLATES

FIELD OF THE INVENTION

This invention relates to lithographic printing plates. More particularly, it relates to on-press ink and/or fountain solution development of lithographic plates having on a substrate a thermosensitive layer capable of hardening or solubilization upon exposure to an infrared laser radiation.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a radiation-sensitive coating deposited on the substrate, the substrate and the radiation-sensitive coating having opposite surface properties. The radiation-sensitive coating is usually a radiation-sensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, and 6,071,675.

Conventionally, the plate is exposed with an actinic light (usually an ultraviolet light from a lamp) through a separate photomask film having predetermined image pattern which is placed between the light source and the plate. While capable of providing plate with superior lithographic quality, such a method is cumbersome and labor intensive.

Laser sources have been increasingly used to imagewise expose a printing plate which is sensitized to a corresponding laser wavelength. This allows the elimination of the photomask film, reducing material, equipment and labor cost.

Among the laser imagable plates, infrared laser sensitive plates are the most attractive because they can be handled and processed under white light. Infrared laser sensitive plates are also called thermosensitive plates or thermal plates because the infrared laser is converted to heat to cause a certain chemical or physical change (such as hardening, solubilization, ablation, phase change, or thermal flow) needed for plate making (although in some systems certain charge transfers from the infrared dye to the initiator may also take place). Various thermosensitive plates have been disclosed in the patent literature. Examples of thermosensitive plates are described below.

U.S. Pat. No. 5,379,698 describes a lithographic plate comprising a top polymer layer, a thin metal layer, and a substrate. The top polymer layer and the substrate have opposite affinity to ink. The plate is imaged by exposing with an infrared laser to thermally ablate the thin metal layer and the top polymer layer, baring the substrate in the exposed areas. While this plate can eliminate the use of photomask, it has the disadvantage of producing hazardous ablation debris during laser exposure, and often requires a cleaning step after exposure.

U.S. Pat. No. 5,705,309 describes a lithographic plate having on a substrate a thermal sensitive layer comprising a photocrosslinkable polymeric binder having pendant ethylenic groups a polyazide photoinitiator, and an infrared absorbing compound. This plate can be exposed with an infrared laser and then developed with a liquid developer to form a negative plate. While this plate allows digital imaging without the use of photomask, it requires a cumbersome liquid development process.

U.S. Pat. No. 5,491,046 describes a lithograghic plate having on a substrate a thermosensitive layer comprising a resole resin, a novolac resin, a haloalkyl substituted s-triazine, and an infrared absorber. This plate is sensitive to ultraviolet and infrared radiation and capable of functioning in either a positive-working or negative working manner. The plate can be imagewise exposed with an infrared laser followed by development to form a positive plate, or can be imagewise exposed with an infrared laser and then baked at elevated temperature followed by development to form a negative plate. While this plate is capable of digital imaging and can act as both positive and negative plate, it requires a cumbersome aqueous alkaline development process.

U.S. Pat. No. 4,132,168 describes a lithographic plate consisting of on a substrate an ultraviolet light (UV) sensitive layer and a top mask layer which is opaque to UV light and is capable of being removed or rendered transparent to UV light by a non-actinic laser radiation. While this plate is capable of digital imaging, it requires two cumbersome chemical processes after exposure, namely a mask layer removal process and a development process.

U.S. Pat. Nos. 5,674,658 and 5,677,106 describe a lithographic printing plate having on a porous hydrophilic substrate an oleophilic imaging layer. The imaging layer comprises a polymeric binder and an infrared absorbing dye, and is capable of bonding to the porous substrate surface through thermal flow upon exposure to a radiation. The non-exposed areas are capable of removal from the substrate by contacting with ink or by peeling. While this plate is useful, it suffers from poor press durability because the image layer in the exposed areas is not hardened (crosslinked) and can be quickly washed off during press operation.

Despite the progress in conventional on-press developable plates and digital laser imagable plates there is a desire for a lithographic plate which can be imaged by thermal laser (infrared laser), does not produce ablation debris, and does not require a separate liquid development process. More specifically, there is a desire for a thermosensitive lithographic plate which is on-press developable with ink and/or fountain solution.

SUMMARY OF THE INVENTION

It is an object of this invention to provide a thermosensitive lithographic plate which is on-press developable with ink and/or fountain solution.

It is another object of this invention to provide a method of on-press developing a thermosensitive lithographic plate comprising on a substrate a thermal sensitive layer which is on-press developable with ink and/or fountain solution.

It is yet another object of this invention to provide a method of on-press imaging and developing a thermosensitive lithographic plate comprising on a substrate a thermosensitive layer which is on-press developable with ink and/or fountain solution.

Further objects, features and advantages of the present invention will become apparent from the detailed description of the preferred embodiments.

According to the present invention, there has been provided a method of lithographically printing images on a receiving medium, comprising in order:

(a) providing a lithographic plate comprising (i) a substrate; and (ii) a thermosensitive layer capable of hardening or solubilization upon exposure to an infrared laser radiation, the non-hardened or solubilized areas of said thermosensitive layer being soluble or dispersible in ink (for waterless plate) or in ink and/or fountain solution (for wet plate), and said thermosensitive layer exhibiting an affinity or aversion substantially opposite to the affinity or aversion of said substrate to at least one printing liquid selected from the group consisting of ink and an abhesive fluid for ink;

(b) imagewise exposing the plate with the infrared laser radiation to cause hardening or solubilization of the thermosensitive layer in the exposed areas; and (c) contacting said exposed plate with ink and/or fountain solution on a lithographic press to remove the thermosensitive layer in the non-hardened or solubilized areas, and to lithographically print images from said plate to the receiving medium.

The plate can be imagewise exposed with an infrared laser on a plate exposure device and then transferred to a lithographic press for on-press development with ink and/or fountain solution by rotating the plate cylinder and engaging ink and/or fountain solution roller. The developed plate can then directly print images to the receiving sheets (such as papers). Alternatively, the plate can be imagewise exposed with infrared laser while mounted on a plate cylinder of a lithographic press, on-press developed on the same press cylinder with ink and/or fountain solution, and then directly print images to the receiving sheets.

DETAILED DESCRIPTION OF THE PREFERRED EMBODIMENTS

The substrate employed in the lithographic plates of this invention can be any lithographic support. Such a substrate may be a metal sheet, a polymer film, or a coated paper. Aluminum (including aluminum alloys) sheet is a preferred metal support. Particularly preferred is an aluminum support which has been grained, anodized, and deposited with a barrier layer. Polyester film is a preferred polymeric film support. A surface coating may be coated to achieve desired surface properties. For wet plate, the substrate should have a hydrophilic or oleophilic surface, depending on the surface properties of the thermosensitive layer; commonly, a wet lithographic plate has a hydrophilic substrate and an oleophilic thermosensitive layer. For waterless plate, the substrate should have an oleophilic or oleophobic surface, depending on the surface properties of the thermosensitive layer.

Particularly preferred hydrophilic substrate for a wet lithographic plate is an aluminum support which has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer which is crosslinked, as described in U.S. Pat. No. 5,922,502.

For preparing printing plates of the current invention, any thermosensitive layer is suitable which is capable of hardening or solubilization upon exposure to an infrared radiation (above 750 nm in wavelength), and is soluble or dispersible in ink (for waterless plate) or in ink and/or fountain solution (for wet plate) in the non-hardened or solubilized areas. Here hardening means becoming insoluble and non-dispersible in ink and/or fountain solution (negative-working), and solubilization means becoming soluble or dispersible in ink and/or fountain solution (positive-working). Hardening is generally achieved through crosslinking or polymerization of the resins (polymers or monomers), and solubilization is generally achieved through decomposition of the resins or their functional groups. An infrared absorbing dye or pigment is usually used in the thermosensitive layer to convert radiation to heat. The thermosensitive layer preferably has a coverage of from 100 to 5000 mg/m$^2$, and more preferably from 400 to 2000 mg/m$^2$.

Thermosensitive layer suitable for the current invention may be formulated from various thermosensitive materials containing an infrared absorbing dye or pigment. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the thermosensitive layer dispersible with ink and fountain solution, or emulsion of ink and fountain solution. Various additives useful for conventional thermosensitive layer can also be used. These additives include pigment, dye, exposure indicator, and stabilizer.

Various infrared radiation sensitive materials have been disclosed in the patent literature. Examples of such thermosensitive materials include U.S. Pat. Nos. 5,219,709, 5,275,917, 5,147,758, 5,491,046, 5,705,308, 5,663,037, 5,466,557, and 5,705,309, and a technical paper entitled "Photopolymerization System Thermally Accelerated by a Laser Diode" by Urano, etc. published in J. Imaging Sci. & Technol., Vol. 41, No. 4, Page 407 (1997). These materials, with appropriate modification (such as addition of certain plasticizer or surfactant) to make them ink and/or fountain solution developable, may be used for the thermosensitive layer of this invention.

Thermosensitive materials useful in negative-working wet plates of this invention include, for example, thermosensitive compositions comprising a polymerizable or crosslinkable monomer or oligomer, thermosensitive initiator, and infrared light absorbing dye or pigment.

Thermosensitive materials useful in positive-working wet plates of this invention include, for example, diazo-oxide compounds such as benzoquinone diazides and naphthoquinone diazides formulated with an infrared dye or pigment.

Thermosensitive oleophobic materials useful in waterless plates of this invention include, for example, compositions comprising polymers having perfluoroalkyl or polysiloxane groups and crosslinkable terminal groups, a thermosensitive initiator, and an infrared absorbing dye or pigment.

Infrared absorbing materials useful in the thermosensitive layer of this invention include any infrared absorbing dye or pigment effectively absorbing an infrared radiation having a wavelength of 750 to 1,200 nm. It is preferable that the dye or pigment having an absorption maximum between the wavelengths of 750 and 1,200 nm. Various infrared absorbing dyes or pigments are described in U.S. Pat. Nos. 5,858,604, 5,922,502, 6,022,668, 5,705.309, 6,017,677, and 5,677,106, and can be used in the thermosensitive layer of this invention. Examples of useful infrared absorbing dyes include squarylium, croconate, cyanine, phthalocyanine, merocyanine, chalcogenopyryloarylidene, oxyindolizine, quinoid, indolizine, pyrylium and metal dithiolene dyes. Cyanine dyes are preferred infrared absorbing dyes. Examples of useful infrared absorbing pigments include black pigments, metal powder pigments, phthalocyanine pigments, and carbon black. Carbon black is a preferred infrared absorbing pigment. Mixtures of dyes, pigments, or both can also be used. These dyes or pigments can be added in the thermosensitive layer at 0.5 to 40% by weight of the thermosensitive layer, preferably 1 to 20%.

Various surfactants may be added into the thermosensitive layer to allow or enhance the on-press ink and/or fountain solution developability. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (such as Tergitol MIM-FOAM from Union Carbide, and Pluronic L43, L64, 1107, P103 and 10R5 from BASF); ethoxylated or propoxylated acrylate oligomers (such as polyethoxylated (20) trimethylolpropane triacrylate, polyethylene glycol (600) diacrylate, and polypropoxylated (6) trimethylolpropane triacrylate, SR415, SR610, and SR501, respectively, from Sartomer Company, Exton, Pa.): and polyethoxylated alkylphenols and polyethoxylated fatty alcohols (such as Triton X-100, Triton X-102, Triton X-165, Triton X-305, Triton X-405, Triton X-705, Triton X-45, Triton X-114, Triton CF-10, Triton CA, and Triton DF-12 from Union Carbide). The nonionic surfactant can be added at 0.5 to 30% by weight of the thermosensitive layer, preferably 1 to 15%.

A particulate dispersion may be added into the thermosensitive layer to enhance, for example, the developability and non-tackiness of the plate, as described in U.S. Pat. No. 6,071,675, the entire disclosure of which is hereby incorporated by reference.

In a preferred embodiment as for negative-working wet lithographic printing plates of this invention, the thermosensitive layer comprises at least one epoxy or vinyl ether monomer (or oligomer) having at least one epoxy or vinyl ether functional group, at least one Bronsted acid generator capable of generating free acid at elevated temperature or through charge transfer from an radiation-activated infrared dye, and at least one infrared absorbing dye or pigment, optionally with one or more polymeric binders. Other additives such as surfactant, dye or pigment, exposure-indicating dye (such as leuco crystal violet, azobenzene, 4-phenylazodiphenylamine, and methylene blue dyes), and acid quencher (usually an alkaline compound, such as tetrabutylammonium hydroxide or triethylamine) may be added. Examples of useful polyfunctional epoxy monomers are 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin. Examples of useful cationic photoinitiators are triarylsulfonium hexafluoroantimonate, triarylsulfonium hexafluorophosphate, diaryliodonium hexafluoroantimonate, and haloalkyl substituted s-triazine. Examples of useful polymeric binders are polybutylmethacrylate, polymethylmethacrylate and cellulose acetate butyrate. Examples of useful infrared absorbing dyes or pigments include cyanine dyes, squarylium dyes, dispersed metal particles, and carbon black.

In a second preferred embodiment as for negative-working wet lithographic printing plates of this invention, the thermosensitive layer comprises at least one polymeric binder (with or without ethylenic functionality), at least one photopolymerizable ethylenically unsaturated monomer (or oligomer) having at least one terminal ethylenic group capable of forming a polymer by free-radical polymerization, at least one free-radical initiator capable of generating free radical at elevated temperature or through charge transfer from an radiation-activated infrared dye, and at least one infrared absorbing dye or pigment. Other additives such as surfactant, dye or pigment, exposure-indicating dye (such as leuco crystal violet, azobenzene, 4-phenylazodiphenylamine, and methylene blue dyes), and free-radical stabilizer (such as methoxyhydroquinone) may be added. Suitable polymeric binders include polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehye, and butadiene/acrylonitrile copolymer. Suitable free-radical polymerizable monomers (including oligomers) include multifunctional acrylate monomers or oligomers (such as acrylate and methacrylate esters of ethylene glycol, trimethylolpropane, pentaerythritol, ethoxylated ethylene glycol and ethoxylated trimethylolpropane, multifunctional urethanated acrylate and methacrylate, and epoxylated acrylate or methacrylate), and oligomeric amine diacrylates. Suitable free-radical initiators include various thermally decomposible free radical initiators, such as azobisisobutyronitrile, benzoyl peroxide, acetyl peroxide, and lauryl peroxide. Various photosensitive free radical initiators can also be used as the free radical initiator of this invention since all photosensitive free radical initiator can produce free radical at elevated temperature or through charge transfer from certain infrared dyes; such photosensitive free radical initiators include the derivatives of acetophenone (such as 2,2-dimethoxy-2-phenylacetophenone, and 2-methyl-1-[4-(methylthio) phenyl]-2-morpholino propan-1-one), benzophenone, benzil, ketocoumarin (such as 3-benzoyl-7-methoxy coumarin and 7-methoxy coumarin), xanthone, thioxanthone, benzoin or an alkyl-substituted anthraquinone, haloalkyl substituted s-triazine (such as 2,4-bis(trichloromethyl)-6-(p-methoxy-styryl)-s-triazine, 2,4-bis(trichloromethyl)-6-(4-methoxy-naphth-1-yl)-s-triazine and 2,4-bis (trichloromethyl)-6-[(4-ethoxyethylenoxy)-naphth-1-yl]-s-triazine), and titanocene (bis($\eta^9$-2,4-cyclopentadien-1-yl), bis[2,6-difluoro-3-(1H-pyrrol-1-yl)phenyl) titanium). Suitable infrared absorbing dyes or pigments include cyanine dyes, squarylium dyes, dispersed metal particles, and carbon black.

When a photoinitiator is used as the free acid or free radical initiator in the thermosensitive layer, the photoinitiator can be sensitive to ultraviolet light (or even visible light), or can be only sensitive to light of shorter wavelength, such as lower than 350 nm. Thermosensitive layer containing ultraviolet light (or visible light) sensitive photoinitiator will also allow actinic exposure with ultraviolet light (or visible light). Thermosensitive layer containing photoinitiator only sensitive to shorter wavelength (such as shorter than 350 nm) will have good white light stability. Each type of initiators has its own advantage, and can be used to design a specific product. In this patent, all types of photoinitiators can be used.

It is noted that, while the cationic or free radical initiator formulated with an infrared dye or pigment thermally decomposes to produce free acid or free radical upon exposure to an infrared radiation, for certain infrared dye certain charge transfers from the infrared dye to the initiator may take place to generate free acid or free radical. However, even if the infrared dye acts as a sensitizer to activate the initiator by charge transfer, the thermal energy from the infrared dye will dramatically increase the rate of the hardening or solubilization reaction. In this patent, any thermosensitive initiating system comprising an initiator and an infrared absorbing dye or pigment capable of generating free acid or free radical upon exposure to an infrared radiation can be used for the thermosensitive layer of the lithographic plate of this invention, irrespective of the free acid or free radical generating mechanism.

The thermosensitive layer should exhibit an affinity or aversion substantially opposite to the affinity or aversion of the substrate to at least one printing liquid selected from the group consisting of ink and an abhesive fluid for ink. For example, a wet plate can have a hydrophilic substrate and an oleophilic thermosensitive layer, or can have an oleophilic substrate and a hydrophilic thermosensitive layer; a waterless plate can have an oleophilic substrate and an oleophobic thermosensitive layer, or can have an oleophobic substrate and an oleophilic thermosensitive layer. An abhesive fluid for ink is a fluid which repels ink. Fountain solution is the most commonly used abhesive fluid for ink. A wet plate is printed on a wet press equipped with both ink and fountain solution, while a waterless plate is printed on a waterless press equipped with ink.

The thermosensitive layer may be conformally coated onto a roughened substrate (for example, with Ra of larger than 0.4 micrometer) at thin coverage (for example, of less than 1.0 g/m$^2$) so that the plate can have microscopic peaks and valleys on the thermosensitive layer coated surface and exhibit low tackiness and good block resistance, as described in U.S. patent application Ser. No. 09/605,018, the entire disclosure of which is hereby incorporated by reference.

An ink and/or water soluble or dispersible protective overcoat may be deposited on top of the photosensitive layer to, for example, protect the photosensitive layer from oxygen inhibition, contamination and physical damage during handling. For plates with rough and/or porous surface capable of mechanical interlocking with a coating deposited thereon, a thin releasable interlayer soluble or dispersible in ink (for waterless plate) or ink and/or fountain solution (for wet plate) may be deposited between the substrate and the thermosensitive layer. Here the substrate surface is rough and/or porous enough and the interlayer is thin enough to allow bonding between the thermosensitive layer and the substrate through mechanical interlocking. Such a plate configuration is described in U.S. Pat. No. 6,014,929, the entire disclosure of which is hereby incorporated by reference.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the plate. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

Infrared lasers useful for the imagewise exposure of the thermosensitive plates of this invention include laser sources emitting in the infrared region, i.e. emitting in the wavelength range of above 750 nm, preferably 750–1500 nm. Particularly preferred infrared laser sources are laser diodes emitting around 830 nm or a NdYAG laser emitting around 1060 nm. The plate is exposed at a laser dosage which is sufficient to cause hardening or solubilization in the exposed areas but not high enough to cause thermal ablation. The exposure dosage is preferably about 50 to about 5000 $mJ/cm^2$, and more preferably about 100 to about 1000 $mJ/cm^2$, depending on the requirement of the thermosensitive layer.

Infrared laser imaging devices are currently widely available commercially. Any device can be used which provides imagewise infrared laser exposure according to digital image information. Commonly used imaging devices include flatbed imager, internal drum imager, and external drum imager. Internal drum imager and external drum imager are preferred imaging devices.

In one embodiment of this invention, the plate is imagewise exposed with an infrared laser radiation in a plate imaging device, and the exposed plate is subjected to on-press development with ink (for waterless plate) or with ink and/or fountain solution (for wet plate). The plate is mounted on the press cylinder as for a conventional plate to be printed. The press is then started to contact the plate with ink (for waterless plate) or with ink and/or fountain solution (for wet plate) to develop the plate, and to lithographically print images from said plate to the receiving medium (such as papers). Good quality prints should be obtained preferably under 20 initial impressions, more preferably under 10 impressions, most preferably under 5 impressions.

In another embodiment of this invention, the plate is exposed on a printing press cylinder, and the exposed plate is directly developed on press with ink and/or fountain solution and then prints out regular printed sheets.

Optionally, if needed, the exposed plate can be subjected to an overall baking or heating process with a heating device such as an oven or an infrared lamp, before on-press development with ink and/or fountain solution. Such a heating process may be performed (for example, with an infrared lamp) while the plate is mounted on the plate cylinder of the lithographic press. For negative working plates, the overall baking or heating can help enhance the hardening of the exposed areas.

For conventional wet press, usually fountain solution is applied (to contact the plate) first, followed by contacting with ink roller. For press with integrated inking system, the ink and fountain solution are emulsified by the various press rollers before transferred to the plate as emulsion of ink and fountain solution. However, in this invention, the ink and fountain solution may be applied at any combination or sequence, as needed for the plate. There is no particular limitation. The recently introduced single fluid ink by Flink Ink Company, which can be used for printing wet lithographic plate without the use of fountain solution, can also be used for the on-press development and printing of the plate of this invention.

Optionally, for wet lithographic plate, the plate may be applied with an aqueous solution, including water and fountain solution, to dampen without developing the plate, before on-press development with ink and/or fountain solution.

This invention is further illustrated by the following examples of its practice. Unless specified, all the values are by weight.

EXAMPLE 1

An electrochemically roughened, anodized, and polyvinyl phosphonic acid treated aluminum sheet was coated using a #6 Meyer rod with a thermosensitive layer formulation TS-1, followed by drying in an oven at 70° C. for 5 min.

TS-1

| Component | Weight ratios |
|---|---|
| Epon 1031 (Epoxy resin from Shell Chemical Company) | 2.114 |
| Cyracure UVR-6110 (Epoxy resin from Union Carbide) | 3.442 |
| Cyracure UVI-6990 (Cationic initiator from Union Carbide) | 1.387 |
| Microlith Black C-K (Carbon black dispersed in polymer binder, from Ciba-Geigy) | 3.750 |
| Ethyl acetate | 78.590 |
| Acetone | 10.717 |

The above plate was exposed with an infrared laser plate imager equipped with laser diodes (8-channels, about 500 mW each) emitting at 830 nm with a laser size of about 15 micrometer (ThermalSetter™, from Optronics International). The plate was placed on the imaging drum (external drum with a circumference of 1 meter) and secured with vacuum (and masking tape if necessary). The exposure dosage was controlled by the drum speed. The plate was exposed at a laser dosage (about 300–500 $mJ/cm^2$) which is sufficient to cause hardening in the exposed areas but not high enough to cause thermal ablation. Visible image pattern (in different tone of black) was seen in the exposed areas.

The exposed plate was subjected to hand test for on-press developability. The plate was rubbed back and forth for 10 times with a cloth soaked with both fountain solution (prepared from Superlene Brand All Purpose Fountain Solution Concentrate made by Varn, Oakland, N.J.) and ink (Sprinks 700 Acrylic Black ink from Sprinks Ink, FL) to check on-press developability and inking. The plate developed completely under 8 double rubs. The non-exposed areas of the thermosensitive layer were completely removed, and the exposed areas of the thermosensitive layer stayed on the substrate. The developed plate showed well inked imaging pattern in the exposed areas and clean background in the non-exposed areas.

EXAMPLE 2

An electrochemically roughened, anodized, and polyvinyl phosphonic acid treated aluminum sheet was coated using a #6 Meyer rod with a thermosensitive layer formulation TS-2, followed by drying in an oven at 70° C. for 5 min.

TS-2

| Component | Weight ratios |
|---|---|
| Epon 1031 (Epoxy resin from Shell Chemical Company) | 2.326 |
| Cyracure UVR-6110 (Epoxy resin from Union Carbide) | 3.786 |
| Cyracure UVI-6974 (Cationic initiator from Union Carbide) | 0.852 |
| CD-1012 (Cationic initiator from Sartomer Company) | 0.252 |
| Neocryl B-728 (Polymeric binder from Zeneca) | 2.520 |
| IR-140 (Infrared dye from Eastman Kodak) | 0.654 |
| FC120 (Surfactant from 3M) | 0.036 |
| Ethyl acetate | 78.825 |
| Acetone | 10.749 |

The plate was exposed and hand developed as in EXAMPLE 1. The exposed plate showed dark-blue color in the image areas. The plate developed completely under 8 double rubs, with the non-imaging areas of the thermal sensitive layer being completely removed. The developed plate showed well inked imaging pattern, and clean background.

EXAMPLE 3

In this example, the plate is the same as in EXAMPLE 2 except that a thin releasable interlayer (a water-soluble polymer) is interposed between the substrate and the thermal sensitive layer.

An electrochemically roughened, anodized, and polyvinyl phosphonic acid treated aluminum sheet was first coated with a 0.1% aqueous solution of polyvinyl alcohol (Airvol 540, from Air Products and Chemicals) with a #6 Meyer rod, followed by drying in an oven at 70° C. for 8 min. The polyvinyl alcohol coated substrate was further coated with the thermosensitive layer formulation TS-2 with a #6 Meyer rod, followed by drying in an oven at 70° C. for 5 min.

The plate was exposed and hand developed as in EXAMPLE 1. The plate developed completely under 4 double rubs, with the non-image areas of the thermosensitive layer being completely removed. The developed plate showed well inked imaging pattern, and clean background.

EXAMPLE 4

An electrochemically roughened, anodized, and silicate treated aluminum sheet was coated using a #6 Meyer rod with a thermosensitive layer formulation TS-3, followed by drying in an oven at 70 C. for 5 min.

TS-3

| Component | Weight ratios |
|---|---|
| Neocryl B-728 polymer (from Zeneca) | 2.637 |
| Ebecryl RX8301 oligomer (from UCB Chemicals) | 0.704 |
| Sartomer SR-399 monomer (from Sartomer) | 4.396 |
| Irgacure 907 initiator (from Ciba-Geigy) | 0.351 |
| Isopropyl thioxanthone (Sensitizer) | 0.175 |
| 2,4-bis(trichloromethyl)-6-(4-methoxy-naphth-1-yl)-s-triazine | 0.219 |
| Leuco crystal violet (Exposure indicator) | 0.070 |
| Pluronic L43 (from BASF) | 0.351 |
| IR-140 (Infrared absorbing dye from Eastman Kodak) | 1.097 |
| 2-Butanone | 90.000 |

The thermosensitive layer coated plate was further coated with a water-soluble overcoat OC-1 with a #6 Meyer rod, followed by drying in an oven at 70° C. for 8 min.

OC-1

| Component | Weight ratios |
|---|---|
| Airvol 205 (from Air Products and Chemicals Company) | 2.0 |
| Fluorad FC-120 (Perfluorinated surfactant from 3M) | 0.02 |
| Water | 100 |

The plate was exposed and hand developed as in EXAMPLE 1. The exposed plate showed purple-blue color in the image areas. This plate developed completely under 6 double rubs, with the non-image areas of the thermosensitive layer being completely removed and the image areas of the thermosensitive layer remaining on the substrate.

EXAMPLE 5

An electrochemically roughened, anodized, and polyvinyl phosphonic acid treated aluminum sheet was coated sequentially with a 0.1% aqueous solution of polyvinyl alcohol (Airvol 540, from Air Products and Chemicals), a 2% IR-125 (water or alcohol soluble infrared dye, from Eastman Kodak) in ethanol solution, photopolymer formulation PS-4, and a 2% IR-125 in ethanol solution. Each coating was coated with a #5 Meyer rod, followed by forced hot air drying. Because both IR-125 and PS-4 coating (after drying) are soluble in ethanol, the two IR-125 coatings and the PS-4 coating are believed to substantially (or at least partially) mix together during the coating of the second 2% IR-125 in ethanol solution.

PS-4

| Component | Weight ratios |
|---|---|
| Neocryl B-728 polymer (from Zeneca) | 3.006 |
| Ebecryl RX8301 oligomer (from UCB Chemicals) | 0.803 |
| Sartomer SR-399 monomer (from Sartomer) | 5.011 |
| Irgacure 907 initiator (from Ciba-Geigy) | 0.400 |
| Isopropyl thioxanthone (Sensitizer) | 0.200 |
| Methoxyether hydroquinone (Antioxidant) | 0.010 |
| Irganox 1035 antioxidant (from Ciba Geigy) | 0.010 |
| Orasol Blue GN dye (from Ciba Geigy) | 0.080 |
| Leuco crystal violet (Exposure indicator) | 0.080 |
| Pluronic L43 (Nonanionic surfactant from BASF) | 0.400 |
| Cyclohexanone | 10.000 |
| 2-Butanone | 80.000 |

The plate was exposed as in EXAMPLE 1. The exposed plate showed purple-blue color in the exposed areas, in contrast to the blue color in the non-exposed areas. The plate was cut into two sheets. The first sheet was directly developed by hand with ink and fountain solution as in EXAMPLE 1, and the second sheet was baked at 100° C. for 5 min. before hand development with ink and fountain solution with the same procedure. Both plates developed completely under 6 double rubs, with the non-image areas of the thermosensitive layer being completely removed and the image areas of the thermosensitive layer remaining on the substrate. The plates were further rubbed with a cloth soaked with ink and fountain solution to check durability. The non-baked plate showed poor durability, and the baked plate showed better durability.

I claim:

1. A method of lithographically printing images on a receiving medium, comprising in order:

(a) providing a lithographic plate comprising (i) a substrate; and (ii) a thermosensitive layer comprising a polymerizable monomer or oligomer, an initiator capable of initiating the polymerization of said monomer or oligomer, and an infrared absorbing dye or pigment; wherein said thermosensitive layer is capable of hardening upon exposure to an infrared laser radiation, is soluble or dispersible in and on-press developable with ink and/or fountain solution, and exhibits an affinity or aversion substantially opposite to the affinity or aversion of said substrate to at least one printing liquid selected from the group consisting of ink and an abhesive fluid for ink;

(b) imagewise exposing the plate with the infrared laser radiation to cause hardening of the thermosensitive layer in the exposed areas; and (c) contacting said exposed plate with ink and/or fountain solution on a lithographic press to remove the thermosensitive layer in the non-hardened areas, and to lithographically print images from said plate to the receiving medium.

2. The method of claim 1 wherein said thermosensitive layer comprises an epoxy or vinyl ether monomer of oligomer having at least one epoxy or vinyl ether functional group, a Bronsted acid generator, and an infrared absorbing dye.

3. The method of claim 1 wherein said thermosensitive layer comprises a free radical polymerizable ethylenically unsaturated monomer or oligomer having at least one terminal ethylenic group, a free-radical initiator, and an infrared absorbing dye.

4. The method of claim 1 wherein said thermosensitive layer further comprises a polymeric binder.

5. The method of claim 1 wherein said infrared absorbing dye or pigment is at from 0.02 to 20% by weight of the thermosensitive layer.

6. The method of claim 1 wherein said thermosensitive layer further comprises a nonionic surfactant.

7. The method of claim 6 wherein said nonionic surfactant is selected from the group consisting of polyethylene glycol, polypropylene glycol, copolymer of ethylene glycol and propylene glycol, and their derivatives, and is at 0.5 to 30% by weight of the thermosensitive layer.

8. The method of claim 1 wherein said substrate is hydrophilic; and said thermosensitive layer is oleophilic and comprises an oleophilic polymeric binder with or without acrylate or methacrylate functional group, a monomer or oligomer with at least one acrylate or methacrylate functional group, a free-radical initiator, and an infrared absorbing dye.

9. The method of claim 8 wherein said free radical initiator is a haloalkyl susbtituted s-triazine.

10. The method of claim 8 wherein said infrared absorbing dye is a cyanine dye.

11. The method of claim 8 wherein said thermosensitive layer further comprises a nonionic surfactant at 0.5 to 30% by weight of the thermosensitive layer.

12. The method of claim 8 wherein said plate further includes a fountain solution soluble or dispersible overcoat on the thermosensitive layer, said overcoat comprising a water-soluble polymer.

13. The method of claim 1 wherein said thermosensitive layer is soluble or dispersible in fountain solution, and said plate is a wet plate.

14. The method of claim 1 wherein said thermosensitive layer is soluble or dispersible in emulsion of ink and fountain solution, and said plate is a wet plate.

15. The method of claim 1 wherein said thermosensitive layer is soluble or dispersible in ink, and said plate is a wet plate or a waterless plate.

16. The method of claim 1 wherein said thermosensitive layer is oleophilic, said substrate is hydrophilic, and said plate is a wet lithographic plate.

17. The method of claim 1 wherein said thermosensitive layer is oleophobic, said substrate is oleophilic, and said plate is a waterless lithographic plate.

18. The method of claim 1 wherein said plate further includes a releasable interlayer interposed between the substrate and the thermosensitive layer, said releasable interlayer being soluble or dispersible in ink and/or fountain solution; wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the thermosensitive layer and the substrate through mechanical interlocking.

19. The method of claim 18 wherein said plate is a wet plate and said interlayer comprises a water-soluble polymer.

20. The method of claim 1 wherein said plate farther includes an ink and/or fountain solution soluble or dispersible overcoat on the thermosensitive layer.

21. The method of claim 20 wherein said plate is a wet plate and said overcoat is fountain solution soluble or dispersible and comprises a water-soluble polymer.

22. The method of claim 1 wherein said substrate has a roughened surface comprising peaks and valleys, and said thermosensitive layer is substantially conformally coated on the roughened substrate surface so that the surface of said thermosensitive layer has peaks and valleys substantially corresponding to the major peaks and valleys of the substrate microscopic surface; and said substrate has an average surface roughness Ra of about 0.2 to about 2.0 microns, said thermosensitive layer has an average coverage of about 0.1 to about 2.0 g/m$^2$, and the average height of the valleys on the thermosensitive layer surface is at least 0.1 microns below the average height of the peaks on the substrate surface.

23. The method of claim 22 wherein the average height of the valleys on the thermosensitive layer surface is at least 0.3 microns below the average height of the peaks on the substrate surface.

24. The method of claim 1 wherein said plate is exposed on an imaging device off the press and then mounted onto a plate cylinder of a lithographic press for on-press development with ink and/or fountain solution, and lithographic printing.

25. The method of claim 1 wherein said plate is mounted on a plate cylinder of a lithographic press for the imagewise infrared laser exposure, on-press development with ink and/or fountain solution, and lithographic printing.

26. A method of lithographically printing images on a receiving medium, comprising in order:

(a) mounting onto a plate cylinder of a lithographic press a lithographic plate comprising (i) a substrate; and (ii) a thermosensitive layer capable of hardening through polymerization or solubilization through decomposition upon exposure to an infrared laser radiation, the non-hardened or solubilized areas of said thermosensitive layer being soluble or dispersible in and on-press developable with ink and/or fountain solution, and said thermosensitive layer exhibiting an affinity or aversion substantially opposite to the affinity or aversion of said substrate to at least one printing liquid selected from the group consisting of ink and an abhesive fluid for ink;

(b) imagewise exposing the plate with the infrared laser radiation to cause hardening or solubilization of the thermosensitive layer in the exposed areas; and (c) operating said press to contact said exposed plate with ink and/or fountain solution to remove the thermosensitive layer in the non-hardened or solubilized areas, and to lithographically print images from said plate to the receiving medium.

27. The method of claim 26 wherein said thermosensitive layer is positive-working and capable of solubilization through decomposition of a polymer or compound in the thermosensitive layer upon exposure to an infrared laser radiation.

28. The method of claim 26 wherein said thermosensitive layer is negative-working and capable of hardening through cationic or free radical polymerization of a monomer or oligomer in the thermosensitive layer upon exposure to an infrared laser radiation.

29. The method of claim 26 wherein said thermosensitive layer is negative-working and comprises an epoxy or vinyl ether monomer or oligomer having at least one epoxy or vinyl ether frictional group, a Bronsted acid generator, and an infrared absorbing dye.

30. The method of claim 29 wherein said thermosensitive layer further comprises a polymeric binder with or without epoxy or vinyl ether functional groups.

31. The method of claim 26 wherein said thermosensitive layer is negative-working and comprises a free radical polymerizable ethylenically unsaturated monomer or oligomer having at least one terminal ethylenic group, a free-radical initiator, and an infrared absorbing dye.

32. The method of claim 31 wherein said thermosensitive layer further comprises a polymeric binder with or without ethylenic groups.

33. The method of claim 26 wherein said plate further includes an ink and/or fountain solution soluble or dispersible overcoat on the thermosensitive layer.

34. The method of claim 33 wherein said plate is a wet plate and said overcoat is fountain solution soluble or dispersible and comprises a water-soluble polymer.

35. The method of claim 26 wherein said substrate is hydrophilic; and said thermosensitive layer is oleophilic and comprises an oleophilic polymeric binder with or without acrylate or methacrylate functional group, a monomer or oligomer with at least one acrylate or methacrylate functional group, a free-radical initiator, and an infrared absorbing dye.

36. The method of clam 35 wherein said plate filer includes a fountain solution soluble or dispersible overcoat on the thermosensitive layer, said overcoat comprising a water-soluble polymer.

37. The method of claim 35 wherein said thermosensitive layer further comprises a nonionic surfactant at 0.5 to 30% by weight of the thermosensitive layer.

38. The method of claim 26 wherein said thermosensitive layer is oleophilic, said substrate is hydrophilic, and said plate is a wet lithographic plate.

39. The method of claim 26 wherein said thermosensitive layer is oleophobic, said substrate is oleophilic, and said plate is a waterless lithographic plate.

40. The method of claim 26 wherein said plate further includes a releasable interlayer interposed between the substrate and the thermosensitive layer, said releasable interlayer being soluble or dispersible in ink and/or fountain solution; wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the thermosensitive layer and the substrate through mechanical interlocking.

41. The method of claim 26 wherein said substrate has a roughened surface comprising peaks and valleys, and said thermosensitive layer is substantially conformally coated on the roughened substrate surface so that the surface of said thermosensitive layer has peaks and valleys substantially corresponding to the major peaks and valleys of the substrate microscopic surface; and said substrate has an average surface roughness Ra of about 0.2 to about 2.0 microns, said thermosensitive layer has an average coverage of about 0.1 to about 2.0 $g/m^2$, and the average height of the valleys on the thermosensitive layer surface is at least 0.1 microns below the average height of the peaks on the substrate surface.

* * * * *